United States Patent
Chun-Jen et al.

(10) Patent No.: US 6,459,148 B1
(45) Date of Patent: Oct. 1, 2002

(54) QFN SEMICONDUCTOR PACKAGE

(75) Inventors: Su Chun-Jen; Lin Chien-Tsun; Chang Chao-Chia; Su Yu-Hsien; Tseng Ming-Hui, all of Kaohsiung (TW)

(73) Assignee: Walsin Advanced Electronics LTD (TW)

( * ) Notice: Subject to any disclaimer, the term of this patent is extended or adjusted under 35 U.S.C. 154(b) by 0 days.

(21) Appl. No.: 09/709,339

(22) Filed: Nov. 13, 2000

(51) Int. Cl.[7] .................. H01L 23/48; H01L 23/495
(52) U.S. Cl. .................. 257/692; 257/666; 257/686; 257/701; 257/787
(58) Field of Search .................. 257/690, 692, 257/686, 687, 673, 666–668, 671, 696, 674, 676, 685, 701–702, 787

(56) References Cited

U.S. PATENT DOCUMENTS

| | | | |
|---|---|---|---|
| 5,394,010 A | * 2/1995 | Tazawa et al. | 257/686 |
| 5,760,471 A | * 6/1998 | Fujisawa et al. | 257/692 |
| 5,942,794 A | 8/1999 | Okumura et al. | 257/666 |
| 5,986,334 A | 11/1999 | Lee | 257/667 |
| 6,057,595 A | * 5/2000 | Pohl et al. | |

* cited by examiner

Primary Examiner—Douglas A. Wille
Assistant Examiner—Dilinh Nguyen
(74) Attorney, Agent, or Firm—Troxell Law Office PLLC

(57) ABSTRACT

A QFN semiconductor package comprises a semiconductor die, a lead frame, bonding wires and a molding compound. The die has an upward topside with a plurality of bonding pads. The lead frame consists of a plurality of inner leads, wherein each inner lead is divided into the front finger portion, the middle protruding portion and the rare connecting portion. The front finger portion is the position of the inner lead to which a bonding wire wire-bonds from the bonding pad of the die. The rare connecting portion is for the electrical out-connection of the package. The middle protruding portion is at height level higher than the front finger portion and the rare connecting portion. The bonding wires electrically connect the bonding pads of the die with the front finger portions of inner leads by means of wire-bonding. A molding compound seals off at least said bonding wires and at least exposes the downside of the die and some surface of the rare connecting portion of each inner lead, therefore improve stability of the inner lead whenever during wire-bonding or after encapsulating.

7 Claims, 3 Drawing Sheets

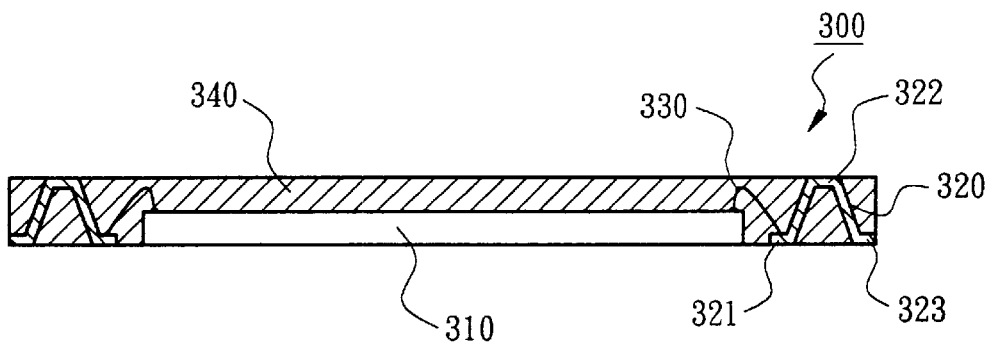
F I G . 4
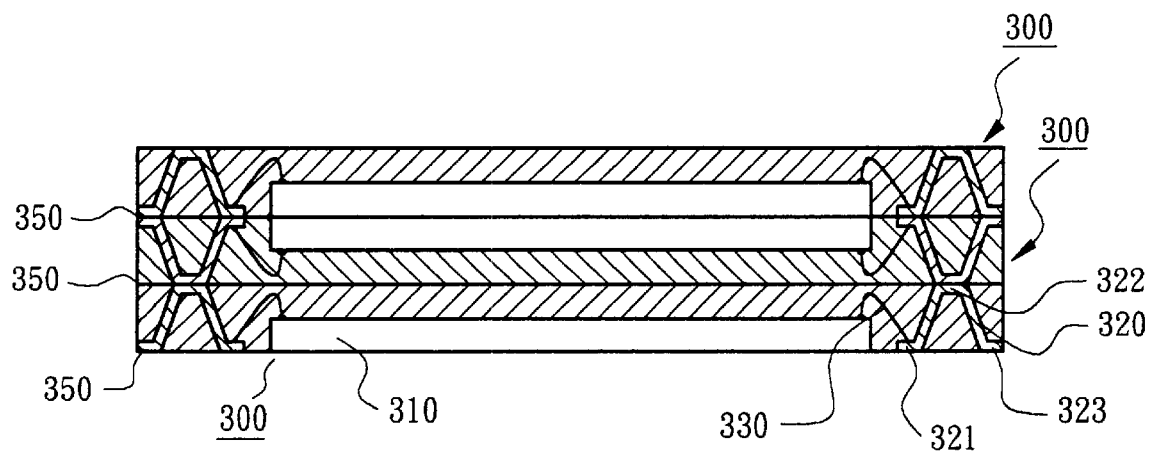
F I G . 5

QFN SEMICONDUCTOR PACKAGE

BACKGROUND OF THE INVENTION

1. Field of the Invention

The present invention relates to a QFN semiconductor package and more particularly to a super thin quad flat non-leaded semiconductor package without die pad.

2. Description of the Prior Art

According to shape of the outer lead, there are three types of Quad Flat Package (QFP), known as Quad Flat I-leaded (QFI) type, Quad Flat J-leaded (QFJ) type, and Quad Flat Non-leaded (QFN) type. With hidden lead and tightly sticking to circuit board during bonding, QFN package accords with the demand of being light, thin and compact for modern electricity components, especially components used in mobile electronics, such as cellular phone or notebook computer, etc.

FIG. 1 shows a sectional view of a generally known QFN package 100; the die 110 is supported by conductive die pad 150 beneath. There are inner leads 120 around the die 110. In order to minimize the height difference and to shorten the distance between inner leads 120 and bonding pad of die 110, each inner lead 120 has a front protruding end with a higher position extended close to die 110 used for conductive wire bonding for electrical connection between the die 110 and the inner lead 120. A drawback is that the front protruding end of the inner lead 120 is hard to be stabilized or supported and then is easy to be forced to bend while wire-bonding. Another drawback is that QFN package 100 gains a thicker thickness due to using the die pad 150 to support the die 110.

A generally known QFN package had been disclosed in U.S. Pat. No. 5,942,794, which has a similar structure as QFN package 100 mentioned in previous, except for using tie bar curving upward on the four corners to support a die pad which forms a higher set area for placing a die, so that the resin can seal the die and bottom of the die pad. Though this structure prevents from the interference between semiconductor die and inner leads, yet it also gains thicker thickness of the package. Because of the inner lead sticking on bottom of the package, there is a height difference and longer distance between the inner lead and the bonding pad of the die, thus a longer bonding wire to electrically connect die and inner lead is necessary. Besides, due to exposing too much surface of the inner lead outside resin encapsulate, it is easy to fall off after encapsulating.

In U.S. Pat. No. 5,986,334, there is another QFN package with better stability for lead frame and die. By using a pre-molding package body to support the die and inner lead, the die and the inner lead get better reliability during wire-bonding and after encapsulating; but the QFN package with a pre-molding body still has a considerable thickness and the producing process of the package becomes more complex in order to produce a special shape of pre-molding package body.

SUMMARY OF THE INVENTION

Therefore it is the first object of the invention to provide a QFN package in which use of the middle part of the inner lead protrudes from both ends of the inner lead so that the inner lead of the thinner QFN package has a strong holding.

It is the second object of the invention to provide a QFN package in which use of the middle part of the inner lead protrudes from both ends of the inner lead and some upper side of the middle part is exposed outside from the molding compound so that the upper face and lower face of the package are used for the outer electrical connection of the package resulting in becoming a stackable QFN package.

It is the third object of the invention to provide a lead frame of QFN package in which use of each inner lead of the lead frame is divided into a front finger portion, a middle protruding portion and a rear connecting portion and furthermore the middle protruding portion has a higher height than the front finger portion and the rear connecting portion so that the lead frame of QFN package is easy to be held in a QFN package.

In accordance with one aspect of the invention, a QFN semiconductor package comprises a die having a upward topside and the topside of die having a plurality of bonding pads; a lead frame consisting of a plurality of inner leads around the die, wherein each- inner lead is divided into a front finger portion, a middle protruding portion, and a rear connecting portion, the front finger portion being configured for the bonding of a bonding wire, the rear connecting portion being configured for the outer electrical connection of the QFN package, the middle protruding portion having a higher height than the front finger portion and the rear connecting portion; bonding wires being bonded to connect the bonding pads of the die and the front finger portions of the inner leads; and a molding compound at least sealing the bonding wires and at least exposing the downside of the die and some surfaces of the rear connecting portions of the inner leads. Thereby, the inner leads of the QFN package have a better holding after encapsulating and a stronger support during wire-bonding.

Further, in accordance with another aspect of the present invention, the inner lead of the QFN package has a middle protruding portion which height is equal to the maximum height of the QFN package resulting in the some upper face of the middle protruding portion exposed to outer of the molding compound for another outer electrical connection of the QFN package. It combines with the some lower face of the rear connecting portion exposed to outer of the molding compound for general outer electrical connection of the QFN package so that the QFN package becomes a stackable package device.

BRIEF DESCRIPTION OF THE DRAWINGS

FIG. 4 is a sectional view illustrating a QFN package according to a second embodiment of the present invention; and FIG. 5 is a sectional view of several QFN packages shown in FIG. 4 in stack condition.

DETAILED DESCRIPTION OF THE PREFERRED EMBODIMENT

Figure 1:
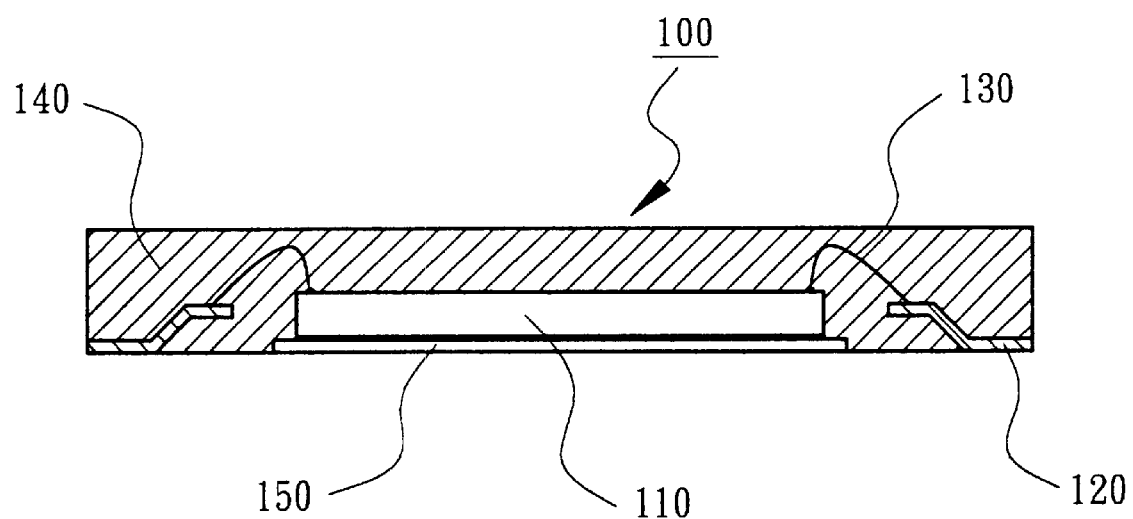
FIG. 1 is a sectional view of a generally known structure of a QFN semiconductor package.

Referring now to the drawings. the QFN packages according to the individual embodiments of the present invention will be described.

Figure 2:
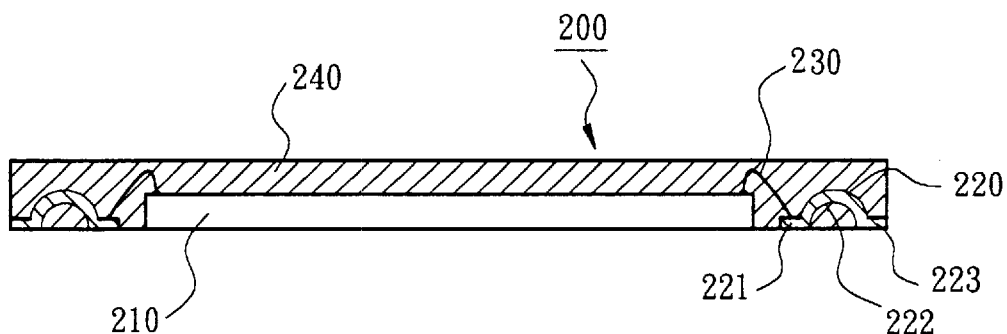
FIG. 2 is a sectional view illustrating a QFN semiconductor package according to a first embodiment of the present invention.

FIG. 2 shows the structure of a quad flat non-leaded package (QFN) according to a first embodiment of the present invention. The QFN package 200 according to the first embodiment comprises a die 210, a lead frame, bonding wires 230 and a molding compound 240.

The die 210 has an upward topside. So-called topside of a chip means a face of the chip is laminated with a variety of desired electrical or electronic circuits and lines and forms a plurality of bonding pads in the edges of the face, and the downside of a chip is the reverse of the topside. Besides, the thickness of a die is between 0.2 and 0.7 mm, 0.3 mm in general.

The bonding wires 230 electrically connect the bonding pads of die 210 with the inner leads 220 of the lead frame, are used for the electrical interconnection of the QFN package 200. Typically, the bonding wires 230 are made of gold, aluminum and copper. Though, the gold is better.

The molding compound 240 is made of insulated thermosetting epoxy resin. It at least seals or covers the bonding wires 230, the topside of the die 210 and some of the inner lead 220 to protect the QFN package structure 200. In this embodiment, in order to reduce thickness, the QFN package structure 200 does not use a die pad and exposes the downside of die 210 and some surface of the inner leads 220 of the lead frame.

The lead frame typically is made of copper or iron. It consists of a plurality of inner leads 220 around the die 210. Each inner lead 220 has a thickness about 0.2 mm and doesn't extend over the QFN package 200. The middle part of the inner lead 220 curves and protrudes from front end and rear end of inner lead 220, formed in an arc for this embodiment, the inner lead 220 is encapsulated with better stability. So each inner lead 220 is divided into the front finger portion 221, the middle protruding portion 222 and the rear connecting portion 223. The front finger portion 221 is the position of inner lead 220 to which the bonding wire 230 wire-bonds from the bonding pad of the die 210 for electrical interconnection between inner lead 220 and die 210. Without using die pad, die 210 has lower height level, thus, when front finger portion 221 sticks to the lower edge, there is less height difference and shorter distance to the die 210 and this prevents inner lead 220 from being crooked and deformed while bonding. The rear connecting portion 223 is for the QFN package 200 to electrically connect to outer elements, such as printed circuit board. When rear connecting portion 223 sticks to edge and with bottom surface exposes to outside of molding compound 240 for electrically connecting to outer, and when middle protruding portion 222 is at the height level higher than front finger portion 221 and rear connecting portion 223, the most rising height of middle protruding portion 222 is less than 0.6 mm and is completely encapsulated by molding compound 240, in this embodiment, thus, the inner lead 220 will have better stability and attachment, as well as not easy to fall off or loosen.

The previous illustration for QFN package structure 200 not only efficiently reduce thickness of the device to less than 0.6 mm of height to become a super thin quad flat non-leaded package, but also comprises the following benefits: 1. Inner lead 220 of lead frame having better stability and not easy to fall off or loosen after encapsulating; 2. Inner lead 220 having better stability and not easy to crook or deform while bonding.

Figure 3:
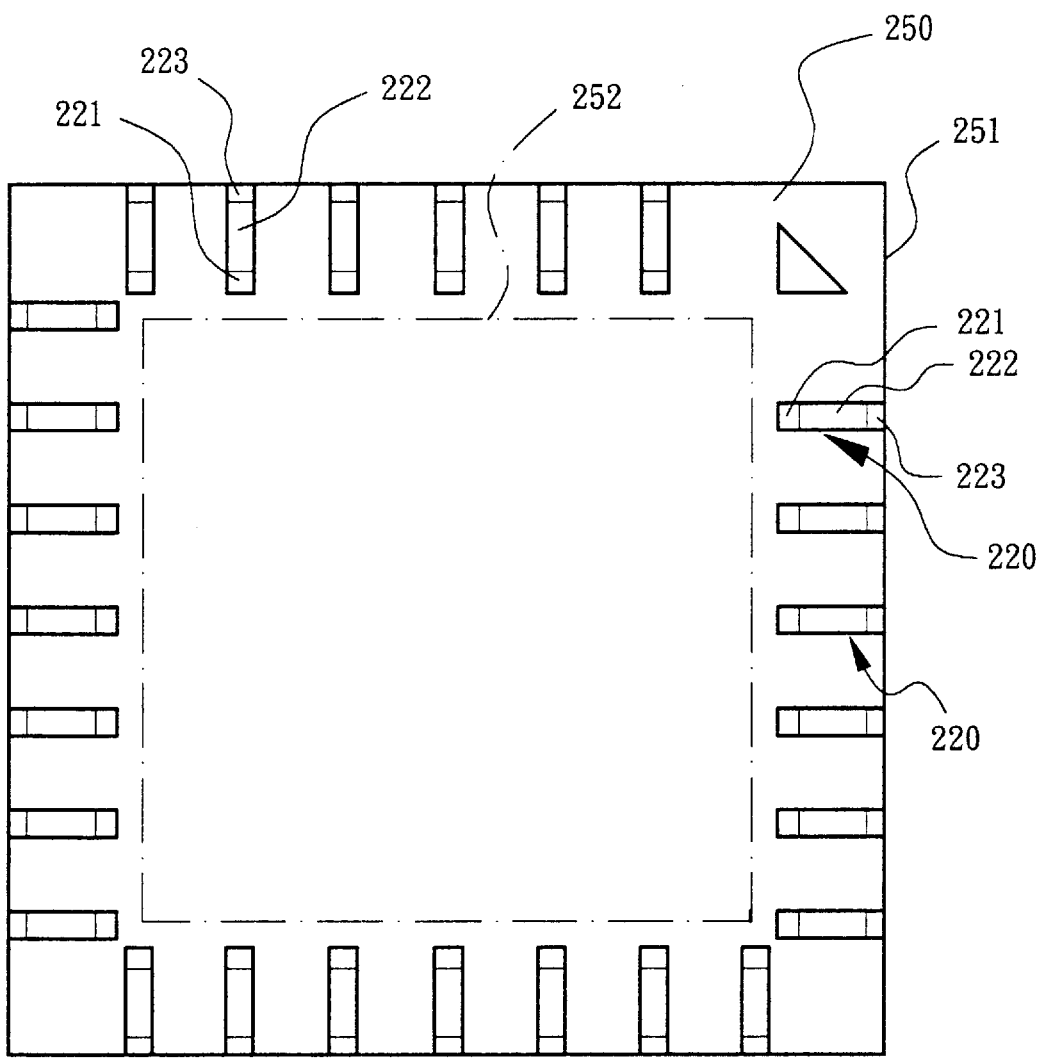
FIG. 3 is a plan view of the lead frame and the die of the QFN package shown in FIG. 2.

To illustrate the feasibility of this QFN package structure 200 of the invention, further enumerates and describes the manufacturing method herein. Stamp copper tinsel, about 0.2 mm in thickness, to form a pre-mentioned lead frame with plurality inner leads 220. Press and bend the inner leads 220 to form the front finger portion 221, the middle protruding portion 222 and the rare connecting portion 223. Stick the copper tinsel to a stable tape such as barrier 250, as showed in FIG. 3. Copper tinsel has been removed or eroded at the area 252 where to place the die 210 on lead frame (the dotted line area in FIG. 3), stable tape 250 supports die 210 directly. Fix die 210 topside facing up to die placing area 252 where copper tinsel removed, and use viscose to fix the die if necessary. Electrically connect die 210 and the front finger portion 221 of the inner lead 220 by means of wire-bonding. Mold the molding area 251 of stable tape 250 with a molding compound 240. After the molding compound 240 being solidified, tear off stable tape 250 and accomplish the QFN package structure 200 of the present invention.

FIG. 4 shows a sectional view illustrating a QFN package having a structure according to a second embodiment of the present invention in order to accomplish: the second object of the present invention, being stackable. This QFN package structure 300 is basically identical to that of the first embodiment except for slightly changes on inner lead 320. Die 310, inner lead 320, bonding wires 330, molding compound 340 and their placement are quite the same as the first embodiment. Middle protruding portion 322 of inner lead 320 is raised up from two ends and in ladder shape. The height of rising middle protruding portion is equal to the maximum height of the QFN package structure 300. Thus, some upper surface of middle protruding portion 322 is exposed to outside of molding compound :340 to form another surface for electrical connection with outsides, to the opposite is the surface of rare connecting portion 323 of the QFN package structure 300. As shown in FIG. 5, when the inner leads 320 of two side of the QFN package structure 300 are reciprocally symmetrical, multiple QFN package structures 300 are capable of being stacked face-to-face, back-to-back. The connecting surface in between rare connecting portions 323 of a upper QFN package and the middle protruding portions 322 of another lower QFN package is bound by using conductive epoxy or solder paste conductive resin. Thus, the QFN: package structure is stackable, supper thick, and inner lead within device is stable after encapsulating or during wire bonding.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A QFN semiconductor package comprising:
   a semiconductor die having an upward topside which have a plurality of boding pads and an opposite facing downside;
   a lead frame consisting of a plurality of inner leads arranged around the semiconductor die, wherein at least one inner lead is divided into a front finger portion, a middle protruding portion and a rear connecting portion, wherein the front finger portion is laterally spaced from the semiconductor die, the front finger portion and the rear connecting portion each having a lower surface coplanar with the downside of the semiconductor die, wherein the middle protruding portion interconnects the front finger portion and the rear connecting portion, and is noncoplanar therewith;
   bonding wires electrically connecting at least one of the plurality of bonding pads of the die and the front finger portion of at least one inner lead; and
   a molding compound encapsulating the semiconductor die, the lead frame and the bonding wires except for the downside of the semiconductor die, and the lower surfaces of the front finger portion and the rear connection portion, such that no portion of the lead frame extends beyond outer boundaries of the molding compound.

2. The QFN semiconductor package in accordance with claim 1, wherein a thickness of the molding compound is less than 0.6 mm.

3. The QFN semiconductor package in accordance with claim 1, wherein the molding compound seals off the middle protruding portions of the inner leads.

4. The QFN semiconductor package in accordance with claim 1, wherein a height of the middle protruding portion is equal to a maximum thickness of the molding compound whereby a portion of the middle protruding portion is exposed at an upper surface of the molding compound.

5. A QFN semiconductor package comprising a lead frame having a plurality of inner leads, wherein the inner leads are arranged around a semiconductor die and have lower surfaces of each end of the inner leads exposed from an encapsulating molding compound and located coplanar with a downside of the semiconductor die, characterized in that the middle part of each inner lead protrudes from the both ends of the inner lead so that the inner leads are securely held in the QFN package.

6. The QFN semiconductor package in accordance with claim 5, wherein the middle parts of the inner leads have ladder shapes.

7. The QFN semiconductor package in accordance with claim 5, wherein the middle parts of the inner leads have arcuate shapes.

* * * * *